(12) United States Patent
Robinson et al.

(10) Patent No.: US 7,190,288 B2
(45) Date of Patent: Mar. 13, 2007

(54) LOOK-UP TABLE DELTA-SIGMA CONVERSION

(75) Inventors: Ian Stuart Robinson, Venice, CA (US); Jeffrey Mark Hinrichs, San Diego, CA (US); Jasmine Upendra Patel, Torrance, CA (US); Paul Charles MacFalda, Redondo Beach, CA (US); Reza Dehmohseni, Oak Park, CA (US); Frederic J. Harris, Lemon Grove, CA (US); Kenneth Weber, Redondo Beach, CA (US)

(73) Assignee: Northrop Grumman Corp., Los Angeles, CA (US)

( * ) Notice: Subject to any disclaimer, the term of this patent is extended or adjusted under 35 U.S.C. 154(b) by 254 days.

(21) Appl. No.: 10/608,932

(22) Filed: Jun. 27, 2003

(65) Prior Publication Data

US 2004/0263365 A1  Dec. 30, 2004

(51) Int. Cl.
*H03M 7/00* (2006.01)

(52) U.S. Cl. ........................ 341/106; 341/143

(58) Field of Classification Search ............... 341/106, 341/143–160, 111, 61, 50–60; 708/313, 708/316; 375/130; 455/260
See application file for complete search history.

(56) References Cited

U.S. PATENT DOCUMENTS

| | | | |
|---|---|---|---|
| 5,012,245 A * | 4/1991 | Scott et al. ................. 341/144 |
| 5,541,864 A | 7/1996 | Van Bavel et al. |
| 5,563,535 A | 10/1996 | Corry et al. |
| 5,859,605 A | 1/1999 | Raghavan et al. |
| 5,864,492 A * | 1/1999 | Sadot ......................... 705/270 |
| 5,870,047 A * | 2/1999 | Piesinger ..................... 341/143 |
| 6,323,795 B1 | 11/2001 | Yang et al. |
| 6,339,621 B1 | 1/2002 | Cojocaru et al. |
| 6,362,755 B1 * | 3/2002 | Tinker ......................... 341/61 |
| 6,437,718 B1 | 8/2002 | Oyama et al. |
| 6,437,719 B1 | 8/2002 | Noro et al. |
| 6,438,434 B1 | 8/2002 | Kamiya |
| 6,441,761 B1 | 8/2002 | Viswanathan |
| 6,459,743 B1 | 10/2002 | Lipka |
| 6,480,129 B1 | 11/2002 | Melanson |
| 6,489,908 B2 * | 12/2002 | Panasik et al. ............. 341/144 |
| 6,498,535 B1 | 12/2002 | Allen et al. |
| 6,515,605 B2 | 2/2003 | Panasik et al. |

(Continued)

FOREIGN PATENT DOCUMENTS

EP  1 257 063 A2  11/2002

OTHER PUBLICATIONS

Yunfeng Liang, and Yong Lian, "A 250MHz CMOS Bandpass Delta Sigma Modulator Using Continuous-Time Resonator Structure (Short Paper)", Dec. 2003.

(Continued)

*Primary Examiner*—Lam T. Mai
(74) *Attorney, Agent, or Firm*—Tarolli, Sundheim, Covell & Tummino LLP (57) ABSTRACT

Signal conversion is implemented employing a memory system operating as a look-up table that stores a plurality of sets of output samples associated with each of a plurality of respective input samples. The look-up table thus can generate a corresponding set of output samples in response to a given input sample, thereby emulating desired digital upsampling and delta-sigma modulation. The output samples can be aggregated, such as by multiplexing, to provide an output data stream at a desired sample rate.

25 Claims, 8 Drawing Sheets

U.S. PATENT DOCUMENTS 6,518,902 B2    2/2003   Panasik et al.
6,556,153 B1 *  4/2003   Cardamone ................. 341/111
6,873,280 B2 *  3/2005   Robinson et al. ........... 341/159

OTHER PUBLICATIONS

European Search Report completed Jul. 22, 2004 for European Application No. 03025731.5-2206.

Ville Eerola, et al., "Second-Order Sampling and Oversampled A/D- and D/A-Converters in Digital Data Transmission", Analog, Circuits and Neural Networks. Singapore, Jun. 11-14, 1991, Proceedings of the International Symposium on Circuits and Systems, New York, IEEE, US, vol. vol. 3 SYMP. 24, Jun. 11, 1991, pp. 1521-1524, XP000616882, ISBN: 0-7803-0050-5.

US 6,496,127, 12/2002, Olson et al. (withdrawn)

* cited by examiner

LOOK-UP TABLE DELTA-SIGMA CONVERSION

TECHNICAL FIELD

The present invention relates generally to signal processing, and more particularly to a system and method for signal conversion employing a look-up table with delta-sigma modulated information.

BACKGROUND OF THE INVENTION

Efforts in the design of integrated circuits for radio frequency (RF) communication systems generally focus on improving performance, reducing cost or a combination thereof. One area of increasing interest relates to conversion of signals, such as from analog-to-digital or digital-to-analog. Both types of conversion have benefited from the development and use of delta-sigma modulation.

Delta-sigma modulation is a technique used to generate a coarse estimate of a signal using a small number of quantization levels and a very high sampling rate. Limiting a signal to a finite number of levels introduces "quantization" noise into the system. Oversampling and the use of an integrator feedback-loop in delta-sigma modulation are effective in shifting noise, including quantization noise, to out-of-band frequencies. The noise shifting properties enable efficient use of subsequent filtering stages to remove noise and produce a more precise representation of the input.

In order to achieve desired efficiency and precision in delta-sigma modulation, a conventional delta-sigma modulator often is required to operate at fast speeds, such as for wireless communications applications. For example, faster delta-sigma modulators can be fabricated using more expensive technologies, such as SiGe or InP. These semiconductor technologies, however, tend to be impracticable and/or cost inefficient in many applications due to their lower yields.

For commercial wireless applications, in particular, there is a need for a low cost approach to implement a digital-to-digital converter having a high dynamic range and desired bandwidth.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to systems and methods to facilitate conversion of a digital signal to another form by employing a look-up table. The look-up table provides a set of plural output samples for given input sample. An aggregator can process the plural output samples and provide a corresponding output data stream at a desired output sample rate.

In one aspect of the present invention, a memory system (e.g., operating as a look-up table) stores sets of plural output samples that are each indexed according one or more possible input samples. The look-up table thus can generate a corresponding set of output samples in response to each given input sample, thereby emulating desired upsampling and delta-sigma modulation, but operating the memory at lower sample rates. The output samples can be aggregated, such as by multiplexing, to provide an output data stream at a desired output sample rate. The rate of the aggregated data stream can be faster than the input sample rate. The output data stream can, in turn, be converted to a corresponding analog signal at a desired output frequency. The look-up table thus can be employed to implement a low cost, high performance digital-to-digital converter, which in turn, can drive a low cost digital-to-analog converter.

In another aspect of the present invention, the look-up table is programmed to store the sets of output data indexed by input samples. The input samples define addresses for the look-up table that can correspond to associated state information and an output of a delta-sigma modulator being emulated by the look-up table. It will be appreciated that the look-up table can run at rates that are slower than the emulated delta-sigma modulator.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates generally to signal conversion in which a memory system (e.g., operating as a look-up table) stores sets of output samples indexed according to a plurality of input samples. The look-up table thus can generate a corresponding set of output samples (e.g., a vector) in response to each input sample. The look-up table thus can emulate desired upsampling and delta-sigma modulation, but operating the memory system at lower sample rates. The output samples can be aggregated, such as by multiplexing, to provide an output data stream at a desired sample rate. The look-up table further can be employed to implement a cost efficient, high performance digital-to-digital or digital-to-analog converter.

Figure 1:
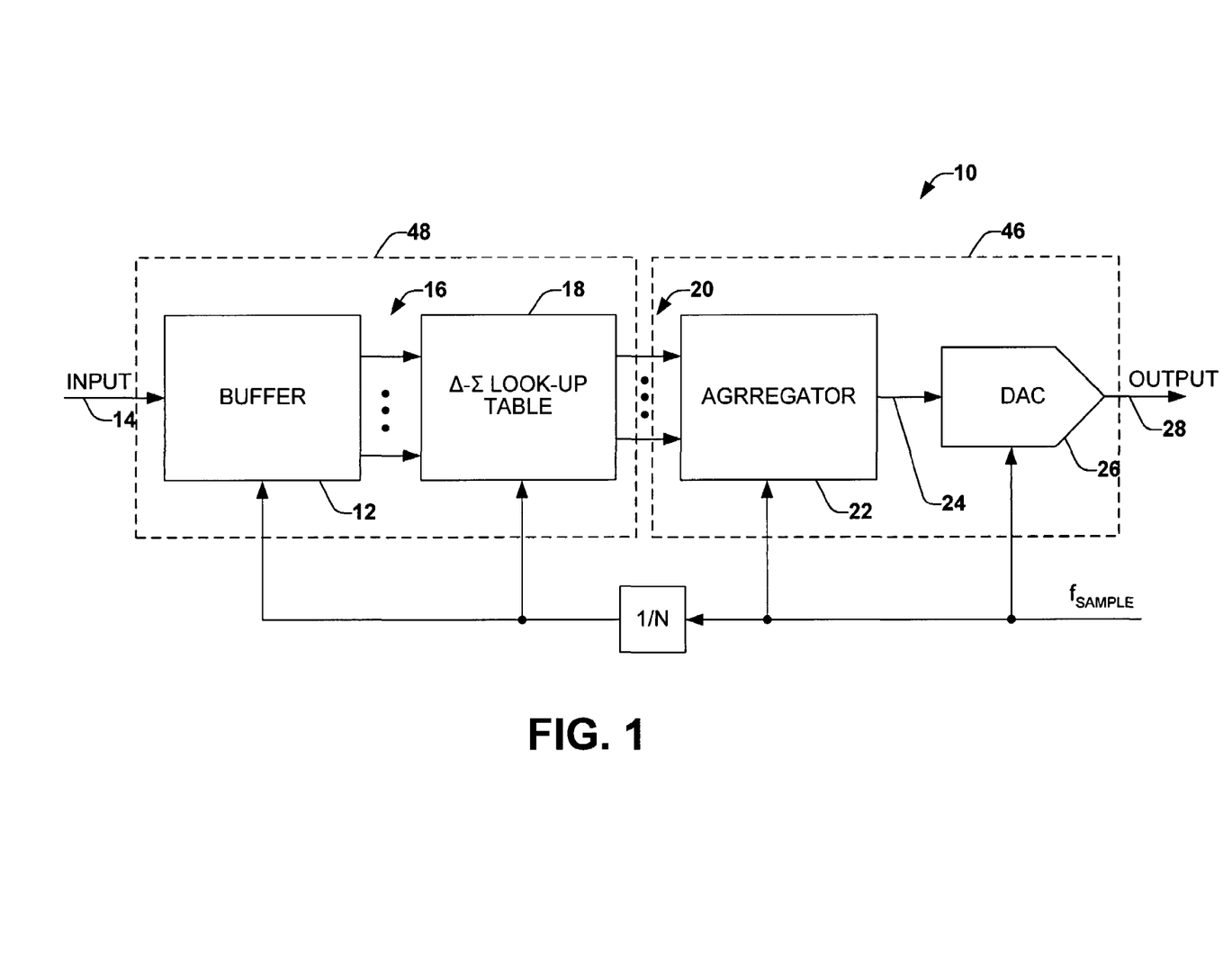
FIG. 1 is a schematic block diagram depicting a conversion system implemented in accordance with an aspect of the present invention.

FIG. 1 schematically depicts a conversion system 10 that can be implemented in accordance with an aspect of the present invention. The system 10 includes a buffer 12 that is operative to buffer an input signal 14. The input signal 14, for example, is a digital signal, such as can be provided from a baseband modulator or Digital Signal Processor (not shown). The input signal 14 can have any number of bits of data, which can be determined as a matter of design choice for a given application.

The input buffer 12 provides a buffered input sample 16 to a look-up table (LUT) 18 in accordance with an aspect of the present invention. The buffered input sample 16 can correspond to one or more input samples (e.g., M input samples, where M is a positive integer $\geq 1$), each sample having a predetermined number of bits provided at an input sample rate. Where the buffered input sample 16 includes more than one input sample, those skilled in the art will appreciated that the LUT 18 will generally be proportionally larger to accommodate the greater number of possible outputs. As described herein, however, because the output data is highly correlated, compression techniques can be employed to facilitate reducing the size of the LUT 18.

The LUT 18 is operative to provide a set or vector of N output samples 20 in response to the buffered input sample 16, where N is a positive integer $1 \leq M \leq N$. In accordance with one aspect of the present invention, the look-up table 18 can be programmed to provide the sets of N output samples 20 to represent possible outputs of a delta-sigma modulator as a function of the possible buffered input samples provided at 16.

By way of example, the buffered input sample 16 can include a single input sample having 16 bits of data. For a given input sample, the LUT 18 provides a set of plural corresponding output samples, in which each output samples has fewer than 16 bits. For example, each of the N output samples includes a single-bit of data. Alternatively, each output sample could include a different number (e.g., more than one) of bits, as desired.

The look-up table 18 can be programmed based on actual experimental data based on operation of a desired delta-sigma modulator, which can be a high order (e.g., $4^{th}$ order bandpass or greater) delta-sigma modulator. Alternatively, or additionally, the LUT 18 can be programmed based on simulated results for a desired delta-sigma modulator or based on theoretical calculations for performing desired delta-sigma modulation on a set of input samples having a predetermined number of bits.

By way of example, the LUT 18 can be programmed to provide output samples corresponding to delta-sigma modulated output samples. As is known in the art of delta-sigma modulation, each input sample 14 can be upsampled by a factor of N to a desired upsampled rate, such as by interpolation of the input samples prior to entering the delta-sigma modulator. The delta-sigma modulator processes the N samples at the upsampled rate, which includes associated noise shaping and quantization. The particular processing function will vary according to the order of filter, desired bandwidth and other performance criteria. The delta-sigma modulator provides N output samples as an output stream at the desired upsampled rate. Each output sample will be of a smaller sample size than the respective input sample, but at a higher sample rate than the input sample rate. Thus, the N output samples provided by the LUT 18 correspond to plural output samples that would be provided by the corresponding delta-sigma modulator for a given set of possible input samples.

Figure 2:
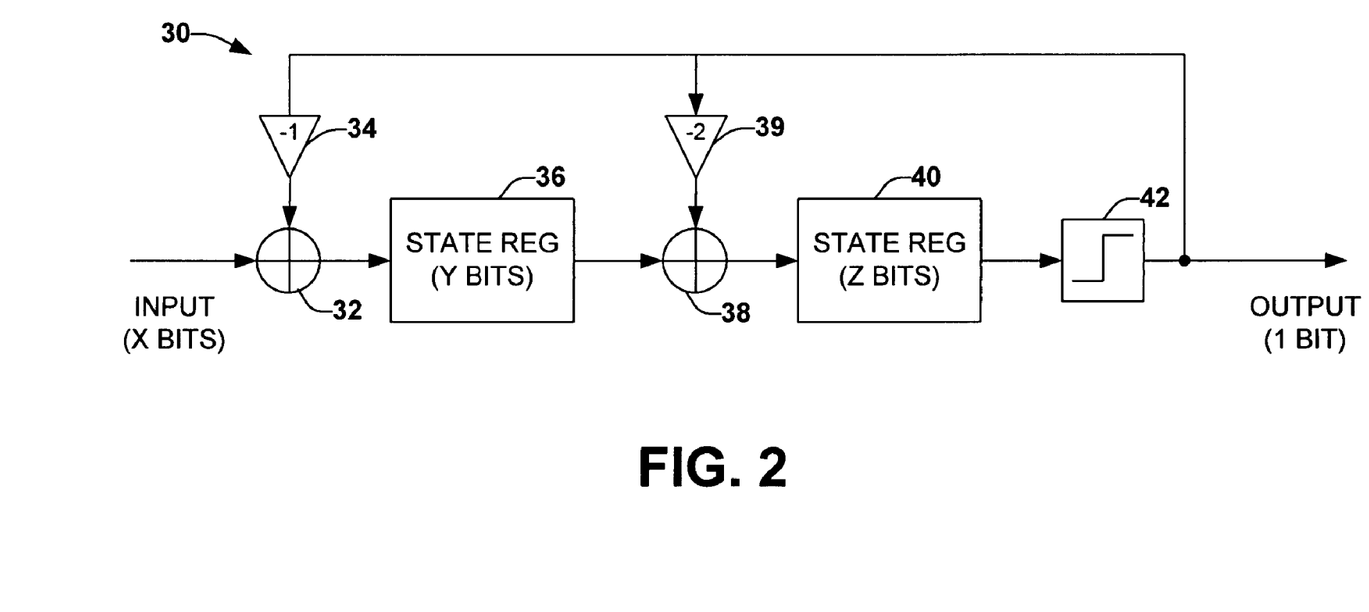
FIG. 2 depicts an example of a state representation for delta-sigma modulation that can be employed to program a look-up table in accordance with an aspect of the present invention.

By way of further example, a delta-sigma modulator can be modeled as a state machine representation, such as the simplified model 30 as shown in FIG. 2. The particular configuration of the model 30 will vary according to the order of the delta-sigma modulator, the type of data being processed, bandwidth requirements and other performance characteristics.

In the example of FIG. 2, a single input sample having X bits (where $X \geq 1$) is provided to a first summer 32. An output value is also provided to the summer 32. In this example, for purposes of illustration only and not by way of limitation, a single-bit output is assumed. It will be appreciated that the output and feedback path, alternatively, could include more than one bit.

The summer 32 provides the sum based on the input and output data to a state register 36. In particular, the signal from the output data is provided to the summer 32 through a multiplier 34, such as can multiply the output data by a coefficient, indicated in this example as −1. The state register 36, for example, stores Y bits (where Y is a positive integer $\geq 1$) of state data, such as indicative of the state of an associated delta-sigma modulation stage. For example, the state register 36 can represent a stage in a delta-sigma modulator, which can include an integration path that integrates an associated output of such stage that is fed back to the input of the stage by a summer. Additionally, the state register 36 can represent associated noise shaping functions that can be performed by feeding the output back to the respective stage through corresponding filters (not shown). The state register 36 provides the Y bits to a summer 38, which adds the state data with the output data through a multiplier 39. In the example, the multiplier corresponds to a coefficient of −2. Those skilled in the art will appreciate that the multipliers 34 and 39 can utilize other coefficients.

The summer 38 provides the summed data to another state register 40. In this example, the state register 40 includes Z bits of data (where Z is a positive integer $\geq 1$). The state register 40 represents another stage of delta-sigma modulation in the model 30. The state register 40 provides the Z bits of state information to a quantizer 42. The quantizer 42 is operative to convert the Z bits of state information to a finite number of quantization levels. For example, the quantizer 42 provides two quantization levels, namely a one-bit output, although other numbers of bits could be provided. Those skilled in the art will understand and appreciate that a similar type of model can be used to represent various other types and orders of delta-sigma modulators, which can include any number of one or more stages.

A look-up table construct to define a delta-sigma modulator, for example, depends at least in part on the number of input bits, the filter order, and type of filter being emulated. Thus, in the context of the model 30 shown and described with respect to FIG. 2, for example, addresses for a corresponding look-up table can be defined as a function of the input (X bits), the state of 36 (Y bits), the state of 40 (Z bits). Stated differently, each LUT entry is addressed with the concatenated bits of X+Y+Z. The output of that address is OUTPUT. Those skilled in the art will appreciate that the LUT data is highly correlated because the output of the quantizer 42, for the example of FIG. 2, is a single-bit and that the states of the various stages also change only incrementally as a function of time. The correlation in the output of delta-sigma modulator thus facilitates compression of such the LUT data to provide a more efficient look-up table in accordance with an aspect of the present invention. The input data stream may also be highly correlated further facilitating compression. The compression can be performed off-line and no decompression step is required to read an entry from the LUT. The absence of speed limitations associated with programming the LUT data enables a wide variety of compression techniques to be applied including passing the contents of the registers Y and Z through additional delta-sigma modulator (digital-to-digital).

Referring back to FIG. 1, the LUT 18 provides the N output samples 20 to an aggregator 22. In accordance with an aspect of the present invention, the N output samples are provided concurrently (e.g., in parallel) to the aggregator 22. The LUT can provide the output samples 20 at about the same sample rate as the input sample 14 and the buffered data 16. The aggregator 22 aggregates the output samples 20 from the LUT 18 to provide a corresponding data stream 24 to an associated digital-to-analog converter (DAC) 26. The aggregator 22 can provide the stream 24 at the desired sample rate $f_{SAMPLE}$.

For example, the aggregator 22 can include an N:b switching system or multiplexer that is operative to serialize the N output samples 20 into the output data stream 24 having a bitwidth b, where b is a positive integer greater than or equal to one. The serialization is facilitated where each of the samples 20 is a one-bit output. If each of the output samples includes more than one bit, the aggregator 22 can include additional components (e.g., hardware and/or software) to provide the data stream in a desired bit format to the DAC 26.

The DAC 26 converts the data stream 24 into a corresponding analog output signal. For example, the data stream 24 corresponds to an aggregate quantized representation of serial data, such as could be generated from an appropriately configured delta-sigma modulator. The aggregator 22 provides the data stream 24 to the DAC 26 at the desired sample rate $f_{SAMPLE}$, which can be N times the input sample rate. The aggregator 22 and DAC 26 both can operate at the desired sample rate $f_{SAMPLE}$, which combination of components may be implemented as part of the same integrated circuit (IC), schematically indicated at 46, using a common fabrication technology. For example, for high-speed wireless communications applications, the DAC and aggregator IC 46 can be implemented using high-speed technology, such as SiGe or InP.

By way of further example, the DAC 26 can be implemented as a high-speed one-bit or multi-bit DAC (e.g., SiGe, InP, or even custom-designed CMOS). It will be understood and appreciated that a high-speed one-bit DAC helps ensure high linearity and low spur levels in the analog output 28 signal. Because such a one-bit DAC can operate at high-speeds, the system 10 is particularly useful for wireless transmitter applications. For example, the DAC 26 can provide the analog output signal 28 directly at a desired transmission frequency so that no additional upconversion or mixing is required prior to transmission. Alternatively, upconversion and mixing can be utilized in situations where higher transmission frequencies may be desired.

In the example of FIG. 1, buffer 12 and LUT 18 can be implemented in any suitable memory device, indicated schematically at 48. For example, the memory device 48 can be DRAM (dynamic random access memory) or SRAM (static random access memory) to name a few. Because, according to an aspect of the present invention, the buffer 12 and LUT 18 can operate at a desired input sample rate, which is less than the output sample rate $f_{SAMPLE}$, the memory device 46 can be fabricated using high-yielding, conventional memory technologies, such as DRAM or SRAM.

Those skilled in the art will understand and appreciate various suitable memory technologies that are readily available. Such memory technologies offer low cost and high yields that typically are not available with more expensive, relatively faster technologies (e.g., SiGe or InP) that would be needed to construct suitable delta-sigma modulators running in real-time. Additionally, those skilled in the art will appreciate that the LUT 18 can be employed to implement in real time a high order and high-speed delta-sigma modulator, which would be either too costly for most practical applications or otherwise would require more processing time than is available for real-time conversion applications. The terms "low-speed" and "high-speed" are used herein in a relative sense to refer to the frequencies of technologies that can be employed to implement various components.

Figure 3:
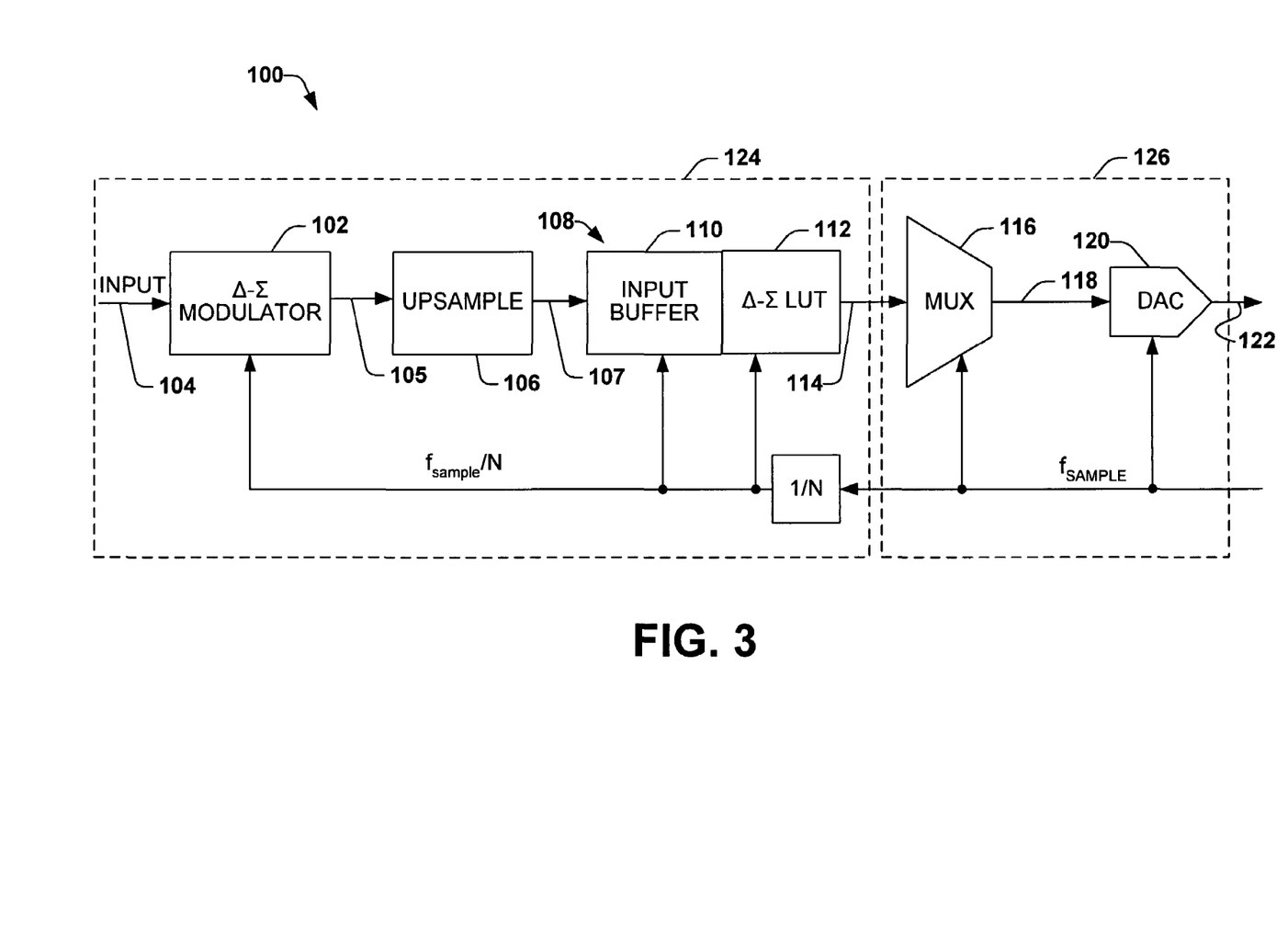
FIG. 3 is a block diagram depicting a two-stage conversion system implemented in accordance with an aspect of the present invention.

FIG. 3 is a block diagram illustrating an example of a multiple stage delta-sigma modulator system 100 that can be implemented in accordance with an aspect of the present invention. While for purposes of simplicity of explanation, the system 100 includes two stages, it will be understood and appreciated that such a multi-stage system could include more than two stages in accordance with an aspect of the present invention.

The system 100 includes a delta-sigma modulator 102 that receives a digital input signal (e.g., baseband) 104. A baseband modulator or digital signal processor ((DSP) not shown) can provide the input signal 104 according to a desired communications protocol. For example, the system 100 can support any desired protocol, which, for example, can be a multi-carrier or multiple access scheme. Examples of such schemes include Global System for Mobile communications(GSM), Enhanced Data Rates for Global Evolution (EDGE), wideband code division multiple access (WCDMA), orthogonal frequency division multiplexing (OFDM), frequency division multiple access (FDMA) and the like.

The delta-sigma modulator 102 processes the input signal 104 and provides a corresponding output signal 106, which is a quantized representation of the input signal. The input signal 104 can be provided at a sample rate that is at least the applicable Nyquist rate of the input signal. The delta-sigma modulator 102 performs noise shaping and quantization on the sampled input signal 104 to provide a quantized output signal 105. The quantized output 105 signal has a reduced number of bits per sample when compared to the input signal 104.

For example, where the input signal 104 has X bits per sample, the delta-sigma modulator 102 operates to reduce the number of bits per sample, such that the output signal has fewer than X bits per sample. The number of bits by which the sample size is reduced and the sample rate of the output signal 106 depend at least in part on the configuration of the delta-sigma modulator 102. The reduction in bits enables subsequent delta sigma modulation (implemented as a LUT according to an aspect of the present invention) to operate with substantially smaller registers or with a much smaller LUT. Additionally, the second delta sigma modulation stage will typically operate at a much faster effective rate than the first stage 102. While the delta-sigma modulator 102 is shown and described as a real-time delta-sigma modulator device, it will be understood and appreciated that this stage alternatively could be implemented as a corresponding LUT programmed to emulate desired delta-sigma modulation in accordance with an aspect of the present invention.

The quantized output signal 105 is provided to an upsampling component 106 that performs upsampling and optionally interpolation on the quantized output signal 105 to provide upsampled, quantized data, indicated at 107, at a desired sample rate. The output sample rate of the signal 107 can be any rate less than a desired high-speed output sample rate $f_{SAMPLE}$.

The output signal 107 is provided to a memory system 108 programmed to emulate delta-sigma modulation according to an aspect of the present invention. The memory system 108 includes an input buffer 110 and an associated delta-sigma LUT 112. The input buffer 110 is operative to buffer the output signal 106 provided by the delta-sigma modulator 102 at the applicable sample rate. The input buffer 12 provides buffered input sample to index the LUT 112. The buffered input sample can include one or more input samples, each sample having a predetermined number of bits, as provided by the delta-sigma modulator 102.

The LUT 112 is operative to provide a vector of N output samples at 114 in response to each buffered input sample, where N is a positive integer equal to or greater than one. In accordance with one aspect of the present invention, the look-up table 112 can be programmed to provide the N output samples 114 representing possible outputs of a delta-sigma modulator in response to each buffered input sample. For example, the LUT 112 can provide the N output samples 114 as a function of the input sample (or samples) 106 buffered by the input buffer 110. That is, each buffered input sample along with the current delta-sigma modulator state information defines a LUT address that maps to a vector of corresponding output samples. Because delta-sigma modulated output data is highly correlated for the possible inputs, compression techniques can be employed to facilitate reducing the size of the LUT 112. Each of the N output samples 114 can include single-bit or multi-bit data. It can be appreciated that the LUT 112 can also be addressed using multiple inputs in sequence, although at a penalty of increasing the LUT size prior to compression. Using multiple input samples, S, enables the memory to run at 1/S times slower than a LUT addressed by a single input sample.

The LUT 112 provides the N output samples 114 to a multiplexer 116. The multiplexer 116 is operative to multiplex or serialize the N output samples to provide a corresponding data stream 118 to an associated DAC 120. The serialization of the N output samples to the data stream 118 can be facilitated where the LUT 112 provides each of the N samples 114 as a one-bit output. The DAC 120 converts the digital data stream 118 to a corresponding analog signal 122 having a desired frequency and bandwidth.

In accordance with an aspect of the present invention, the multiplexer 116 and DAC 120 run at an increased sample rate relative to the sample rate of the LUT 112. The relative speeds of the different components can be achieved by implementing the delta-sigma modulator 102 and memory system 108 using a low-speed technology and implementing the multiplexer 116 and DAC 120 with a high-speed technology. For example, the delta-sigma modulator 102 and memory system 108 can define an integrated circuit (e.g., an application specific integrated circuit or portion thereof) 124 using a low-speed technology, such as CMOS and comparable memory technology. The multiplexer 116 and DAC 120 can define another integrated circuit 126 using a high-speed technology, such as SiGe, InP or the like.

By way of further example, the multiplexer 116 provides the data stream 118 to the DAC 120 at a desired sample rate $f_{SAMPLE}$, which is N times the input sample rate. That is, the LUT 112 provides the N output samples 114 to the multiplexer at a sample rate of about $1/N * f_{SAMPLE}$. For the example of GSM time-division multiple access (TDMA), the multiplexer 116 and DAC 120 can operate at a sample rate $f_{SAMPLE}$ of about 3.77 GHz while the delta-sigma modulator and memory system can operate at about 418 MHz (e.g., N=9).

As mentioned above, the DAC 120 provides the analog output signal 122 at a desired frequency, which can be directly at a desired transmission frequency so that no additional analog upconversion or mixing is required prior to transmission. The transmission frequency can be proportional to the output sample rate $f_{SAMPLE}$. Alternatively, simplified upconversion and mixing can be utilized in situations where higher transmission frequencies may be desired. Those skilled in the art thus will appreciate that the cascaded arrangement of low-speed circuitry 124 can be employed to reduce the number of bits per sample of the input signal (e.g., a multiple-access signal) to facilitate digital tuning for analog transmission.

It will further be understood and appreciated that the DAC 120 can be a single-bit DAC or a multi-bit DAC. For wireless applications when the DAC 120 provides the analog output signal directly at the desired transmission frequency, a high-speed one-bit DAC helps ensure high linearity and low spur levels in the analog output signal 122. Because such a one-bit DAC has very few devices and lower power consumption than a comparable multi-bit DAC, it can operate at high-speeds, so the system 100 is particularly useful for wireless transmitter applications.

Figure 4:
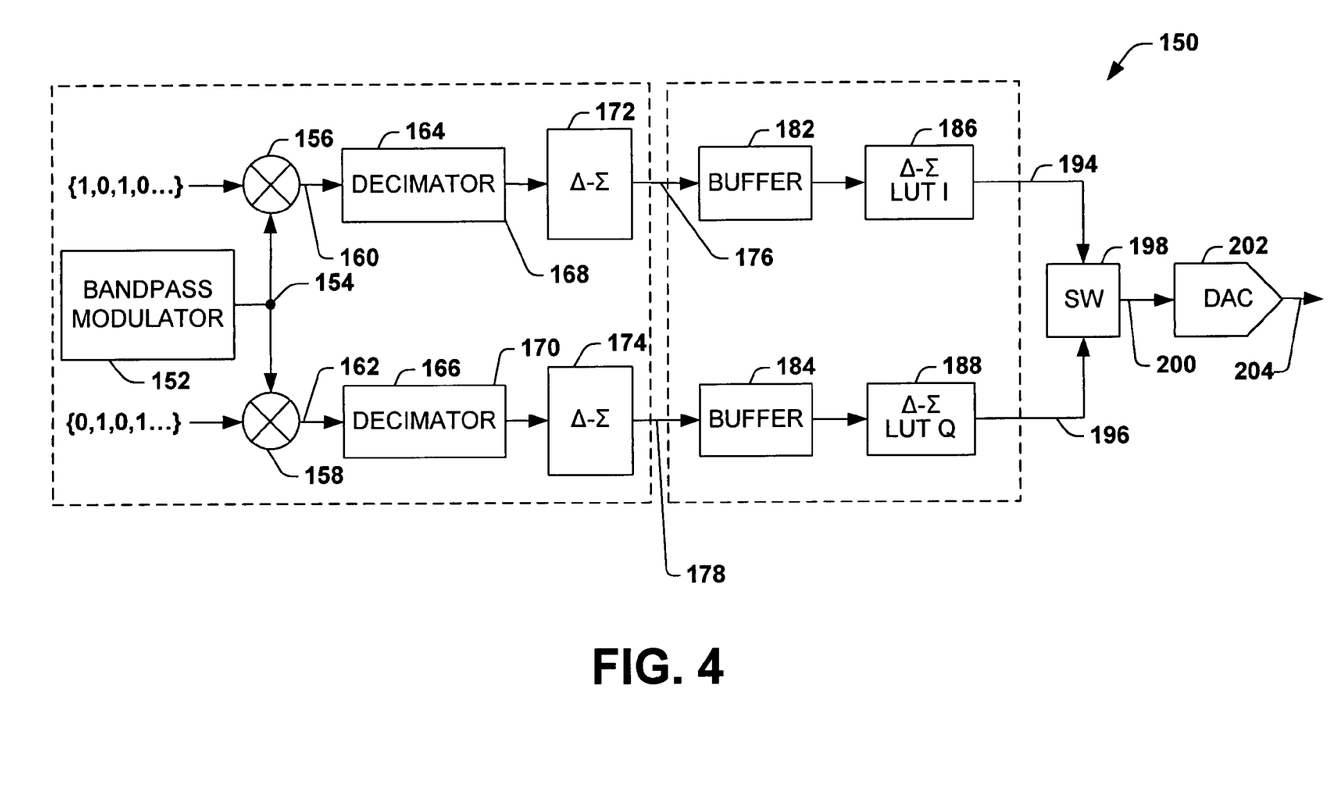
FIG. 4 is a block diagram depicting a two-stage conversion system implemented with separate paths for I-Q components in accordance with an aspect of the present invention.

FIG. 4 illustrates an example of a conversion system 150 in accordance with an aspect of the present invention. The system 150 splits an input baseband digital signal into component parts to enable desired delta-sigma modulation to run at a reduced sampling rate while maintaining system performance. This approach is particularly desirable for a subset of delta-sigma modulators, which can be referred to as a $f_{sample}/4$ delta-sigma modulator or a bandpass design of delta-sigma modulator.

The system 150 includes a bandpass modulator that provides a digital multi-carrier signal, such as, for example, GMSK/EDGE/WCDMA. The bandpass modulator 152 provides the digital signal 154 to a pair of multipliers 156 and 158. Each of the multipliers 156 and 158 is operative to separate the input signal 154 into respective in-phase (I) and quadrature (Q) components 160 and 162. Normally, I/Q decomposition requires mixing each path with the cosine and sine, respectively of the carrier. Since the DSM is running at $1/4^{th}$ (or other fraction of) the carrier frequency the sines and cosines have regular patterns of alternating zeroes and ones, where the sine is a sample out of phase with the cosine term. Accordingly, the decomposition by the respective multipliers 156 and 158 is accomplished by multiplying the digital signal 154 by alternating ones and zeros. Thus, the multipliers 156 and 158 provide I and Q components 160 and 162, respectively, to decimators 164 and 166. For example, the decimators cause each of the I and Q data streams 160 and 162 to be down-sampled to a lower sample rate, removing the zeroes, such as one-half of their original sample rate. Suitable delays (not shown) can be implemented for synchronization purposes. The decimators 164 and 166 provide down-sampled I and Q component signals 168 and 170, respectively, to respective delta-sigma modulators 172 and 174. Each of the delta-sigma modulators 172 and 174 is operative to convert the down-sampled I and Q data streams 168 and 170 to corresponding output samples 176 and 178. It will be appreciated that the signals 176 and 178 have fewer bits per sample than signals 168 and 170 and that this reduction in bit width helps to reduce the size of the subsequent LUT's.

The delta-sigma modulators 172 and 174 provide corresponding output samples 176 and 178, respectively of the I and Q data streams 168 and 170 to an associated memory system 180. The memory system 180 is programmed and/or configured to implement look-up tables for each I and Q data stream that emulate desired delta-sigma modulation. Each stream can be processed at one-half the rate of a single DSM.

In this example, separate buffers 182 and 184 and LUTs 186 and 188 are provided for each of the I and Q data 176 and 178 provided from the preceding delta-sigma modulation stages 172 and 174. The buffers 182 and 184 provide buffered input samples to the respective LUTs 186 and 188, which define LUT addresses. The LUTs 186 and 188 can run at approximately the same sample rate as the stages 172 and 174.

The LUTs 186 and 188 provide respective vectors of output samples 194 and 196 in response to each respective buffered input samples, where plural output samples are provided for each I and Q buffered input sample. In accordance with one aspect of the present invention, each look-up table 186 and 188 can be programmed to store the N output samples for each of a plurality of input samples representing possible outputs of a delta-sigma modulator as a function of the possible input samples.

Each of the output samples 194 and 196 provided by the respective LUTs 186 and 188 can be one-bit or mult-bit data. The output samples 194 and 196 can be provided concurrently in parallel to the switching system 198. The output samples 194 and 196, for example, represent sequential output samples of delta-sigma modulators based on which the look-up tables 186 and 188 were programmed. In accordance with an aspect of the present invention the memory system 180, including buffers 182 and 184 and look-up tables 186 and 188, are implemented using low cost memory technology. The output samples 194 and 196 are provided concurrently at a lower sample rate than ultimately desired. Thus, the switching system 198 is operated at a desired, faster sample rate to provide an output sample stream 200 at the desired output sample rate.

For example, where each of the output samples 194 and 196 include N samples, the switching system 198 can be operated at N times the rate of the memory system 180. The switching system 198, in turn, aggregates or recombines the I and Q components 194 and 196. The aggregation implemented by the switching system 198, for example, can include processing to synchronize and properly re-sample the I and Q components. The switching system 198 thus serializes the respective samples to provide the corresponding data stream 200 to a DAC 202 at a desired sample rate. To facilitate synchronization of the I and Q data components, delays (not shown) can be implemented in each of the respective paths. The delays can be many clock cycles to compensate for the upsampling. The DAC 202 also operates at the desired output sample rate to facilitate converting the data stream 200 to a desired analog signal 204. The analog signal can be provided at desired center frequency and bandwidth. In one aspect, the center frequency can be a desired radio transmission frequency, which can be in the MHz or GHz range.

Figure 5:
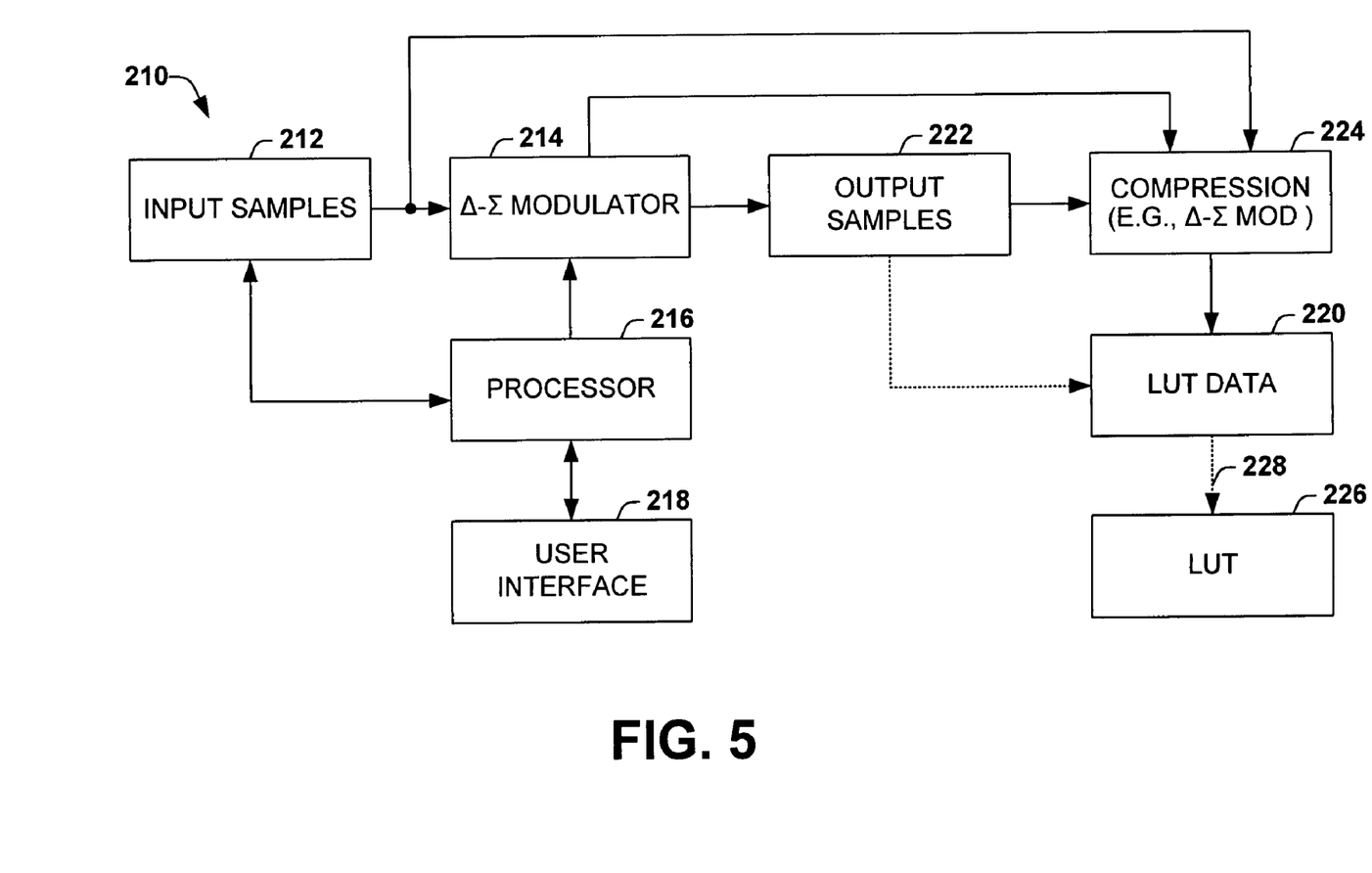
FIG. 5 is an example of a system that can be employed to generate look-up table data in accordance with an aspect of the present invention.

FIG. 5 illustrates an example of a system 210 that can be utilized to program a look-up table in accordance with an aspect of the present invention. The system 210 includes an input sample memory 212 that is operative to provide input samples to an associated delta-sigma modulator 214. The memory system, for example, can include a buffer or other memory device capable of providing input samples of a desired bit size to the delta-sigma modulator 214. For example, the system 210 can be implemented as part of a computer system having an associated processor 216. The system 210 also can include an associated user interface 218 that enables a user to set parameters for the system 210 including for example input sample size for the delta-sigma modulator 214, configure the order of delta-sigma modulation, and a desired output sample size for the delta-sigma modulator that is to be stored as the look-up data 220. The LUT contains a set of addresses and one or more outputs per address. The user interface 218 also can provide a mechanism for the user to initiate the programming process to generate the desired look-up data 220.

The delta-sigma modulator 214 can be hardware, software, or a combination thereof operative to perform desired up-sampling, quantization and noise shaping on the input samples in the memory 212. The delta-sigma modulator 214 in turn provides output samples of the quantized data to associated output sample memory 222. For example, the delta-sigma modulator 214 provides a data stream of X-bits per sample to the memory 222, where X is a positive integer greater than or equal to 1. The memory 222 can be configured to organize the output samples into groups or sets of N output samples, where N is a positive integer greater than or equal to 1. Each set of N output samples provided by the delta-sigma modulators corresponds to a vector of output samples associated with a given input sample, defined by the delta-sigma modulation processing by the delta-sigma modulator 214.

Advantageously, the delta-sigma modulator 214 can be a high order delta-sigma modulator containing many loops and integration to provide high precision output samples. While such high precision output data may require some significant processing time generally not suitable for real time communication applications, the processing time is essentially inconsequential for programming a look-up table in accordance with an aspect of the present invention. This is because the look-up table will not experience such processing delays, and further can run at a desired slower speed and generate the same output as the delta-sigma modulator 214.

The output samples from the delta-sigma modulator 214 can be utilized directly to program the look-up table data 220. For a situation where each of the output samples is a single-bit sample, there typically will be $2^Y$ possible output samples that will need to be generated, where Y corresponds to the number of input samples.

Those skilled in the art will understand and appreciate that the output data is highly correlated in time. This is because the output of the delta-sigma modulation for a single-bit output or low number of bits changes very little over time. Additionally, states associated with performing delta-sigma modulation also change incrementally over time. Because of such correlation in the output, the output samples can be provided to a compression block 224. The compression function 224, for example, can be implemented by passing one or more of the input samples, register states from the delta-sigma modulator 214, and the output sample data through one or more levels of compression, which can include the use of a digital-to-digital delta-sigma modulator for some or all of these data. The degree of compression achieved through additional delta-sigma modulation is high and is balanced against the allowable degradation in the dynamic range of the LUT delta-sigma modulator.

Those skilled in the art will understand and appreciate various other compression techniques that can be utilized to compress the look-up table data and thereby reduce the memory requirements for implementing a delta-sigma modulator look-up table in accordance with an aspect of the present invention. The compression component 224 thus provides the look-up table data 220 in a compressed form, which facilitates storage and retrieval of data in memory programmed to implement a look-up table in accordance with an aspect of the present invention.

For example, the LUT data 220 can be transferred to program a suitable memory device 226 to operate as a LUT according to an aspect of the present invention. Those skilled in the art will understand and appreciate that the memory device 226 can be substantially any type of conventional memory device, including volatile memory (e.g., RAM, such as SRAM or DRAM, and the like) or non-volatile memory (e.g., ROM, FLASH memory and the like). The operation of programming the memory device 226, which is schematically indicated at 228, can be implemented using any conventional technique.

Because conventional low-speed memory technology can be employed to emulate a delta-sigma modulator and achieve comparable performance to that provided by high-speed, more expensive technology (e.g., a high-speed delta-sigma modulator), a significant cost savings can be achieved by employing a look-up table programmed according to an aspect of the present invention. Additionally, because the look-up table can be programmed offline, more precise delta-sigma modulation requiring greater processing time can be employed to program the look-up table than would be typically be available if comparable high-speed delta-sigma modulation were implemented in real time. The cost savings and improved performance can be achieved because a suitable look-up table can be implemented using low cost memory technology, which tends to be more practicable for commercial wireless applications.

Figure 6:
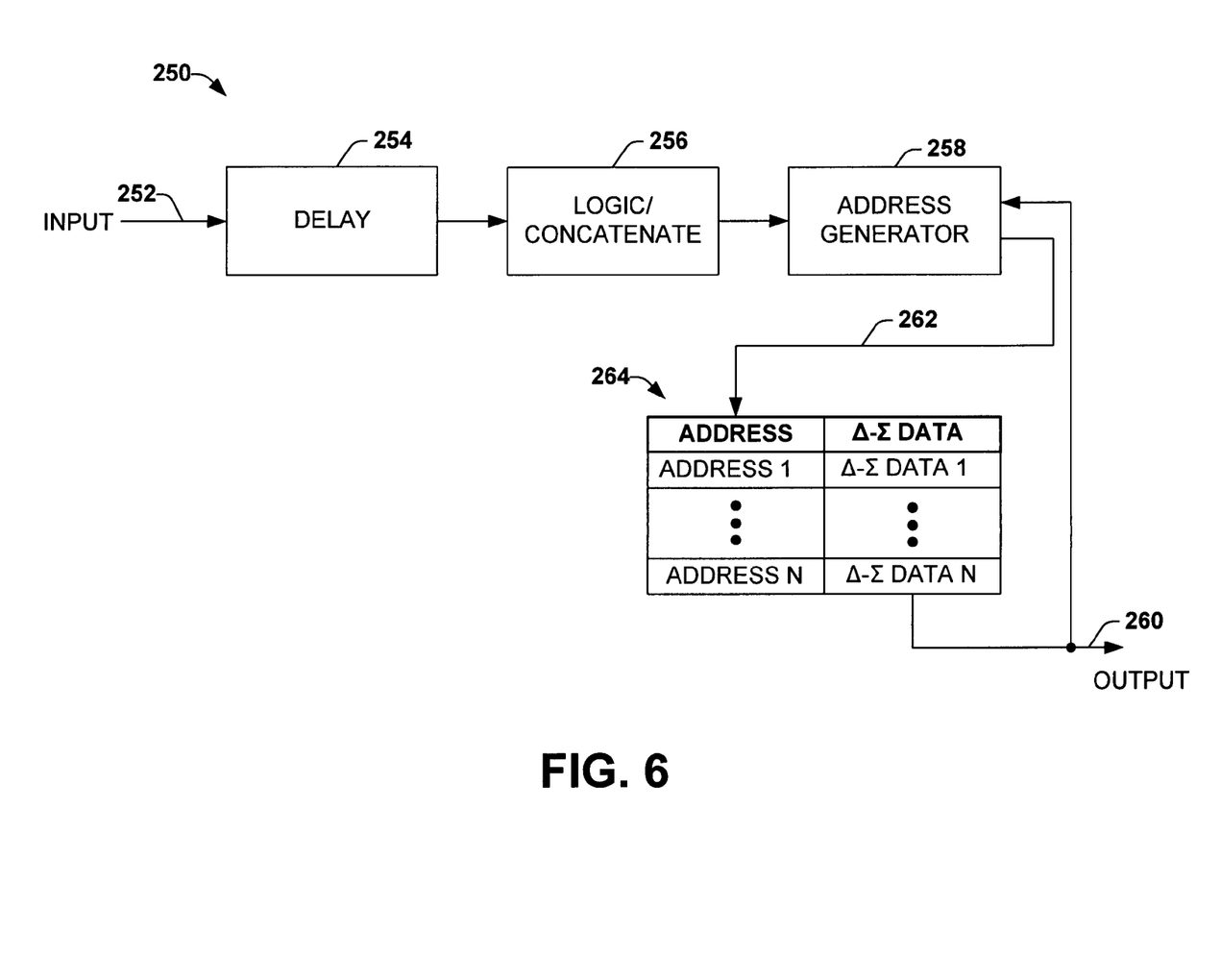
FIG. 6 is an example of a look up table system that can be implemented according to an aspect of the present invention.

FIG. 6 illustrates an example of a look up table system 250 that can be implemented in accordance with an aspect of the present invention. The system 250 receives one or more input samples at 252 at an input sample rate. In the example illustrated in FIG. 6, the system 250 includes an optional delay block 254 that can be utilized to delay or buffer the input samples 252, such as where a sequence of one or more prior inputs is to be utilized in connection with providing corresponding delta-sigma modulation data.

The delayed or buffered signal is provided to a logic/concatenate block 256 for preprocessing the input signal into a suitable form. For example, the logic/concatenate block 256 parses the input sample(s) provided by the delay block 254 and links or joins plural input samples together in a desired manner. Additional logic functions can be performed on the one or more input samples to facilitate aggregating data into a desired form that facilitates generating an address associated with delta-sigma modulated data. The concatenated data is provided to an address generator 258.

The address generator 258 can also receive an indication or representation of the previous output signal at 260. The address generator 258 can derive a corresponding address for the one or more input samples 252 based on the present output individually or in combination with one or more previous outputs in addition to the concatenated data from the logic/concatenate block 256. Additionally or alternatively, the address generator 258 can employ one or more previously generated addresses in combination with the concatenated sample data to ascertain a new address for the respective input sample at 252.

The address generator 258 provides the corresponding address 262 to locate corresponding delta-sigma data stored in the LUT 264, which will normally use a suitable form of memory such as RAM or DRAM. For example, delta sigma modulation data can be stored in memory at respective address locations defined by addresses generated by performing corresponding delta sigma modulation data, such as shown and described in FIG. 5. That is, each address 262 maps to corresponding data stored in the LUT 264 that is provided as output data at 260, which data has been pre-programmed to approximate delta sigma modulation for the set of available addresses. The output signal at 260 can be provided at a reduced bitwidth and increased sample rate as compared to the input sample at 252, thereby emulating desired digital upsampling and delta-sigma modulation. Those skilled in the art will understand and appreciate various configurations and approaches that can be utilized to store and access the delta sigma modulation data in the LUT 264.

Figure 7:
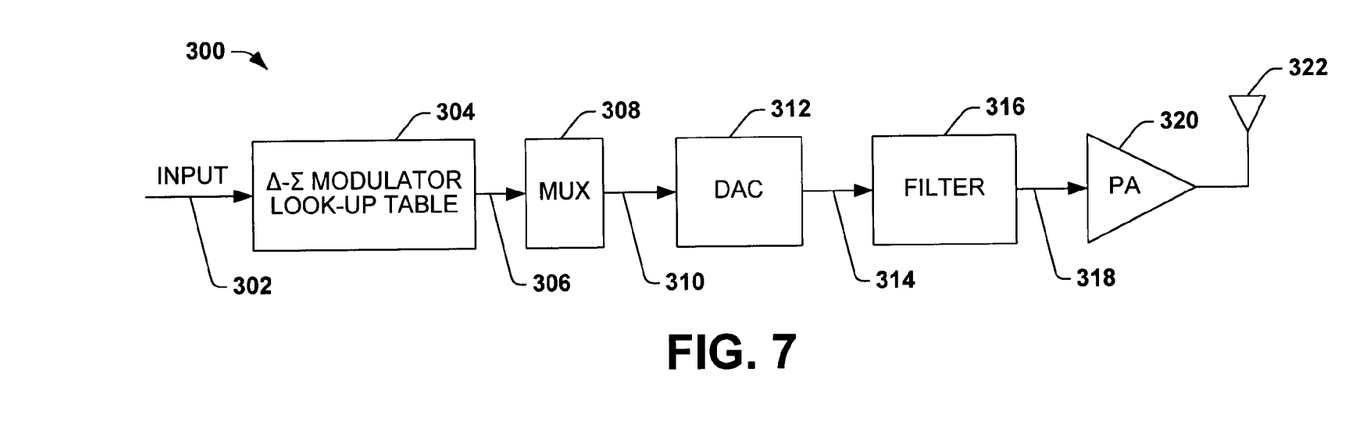
FIG. 7 is a block diagram depicting part of a communications system incorporating a conversion system in accordance with an aspect of the present invention.

FIG. 7 is an example of part of a transmitter 300 that can be implemented using a LUT delta-sigma modulation in accordance with an aspect of the present invention. A digital input signal 302 is provided to an input of a delta-sigma modulator LUT 304 implemented according to an aspect of the present invention. The delta-sigma modulator LUT 304 (e.g., as shown and described in FIG. 1) provides plural output samples 306 to a multiplexer or other aggregator 308 in response to each input sample. The multiplexer 308 serializes the output samples 306 to provide a corresponding data stream 310 to a corresponding DAC 312, such as at fewer bits at a higher sample rate as compared to the digital input signal.

In this example, the DAC 312 converts the quantized signal 310 directly to an analog signal 314 at a desired radio transmission frequency, which can be in the upper MHz or GHz range. By way of particular example, for GSM, the desired transmission frequency can be a spectrum with a center frequency at about 940 MHz. It will be understood and appreciated that other radio transmission frequencies (e.g., in the MHz range or higher) can be efficiently and cost effectively provided in accordance with an aspect of the present invention.

The analog signal 314 is then filtered, such as with an analog bandpass filter 316, to remove out-of-band emissions and noise. The filtered output 318 is then provided to a power amplifier 320 that amplifies the signal 318 to a desired level. The power amplifier 320 then feeds one or more antennas 322 that propagate the amplified signal through air or some other wireless medium (e.g., space).

As mentioned above, it will be appreciated that such digital-to-analog conversion to a desired transmission frequency is facilitated by employing a delta-sigma modulator LUT 304 in conjunction with a high-speed DAC 312 according to an aspect of the present invention. For example, the LUT 304 can be implemented using low-speed, high yield memory technologies, which as described herein can closely approximate a high-speed, more expensive delta-sigma modulator but at a significant cost reduction. This enables a high-speed DAC (e.g., SiGe or InP operating in the GHz range) to be utilized to convert the quantized data stream from the network directly to a desired transmission frequency without requiring additional upmixing.

Figure 8:
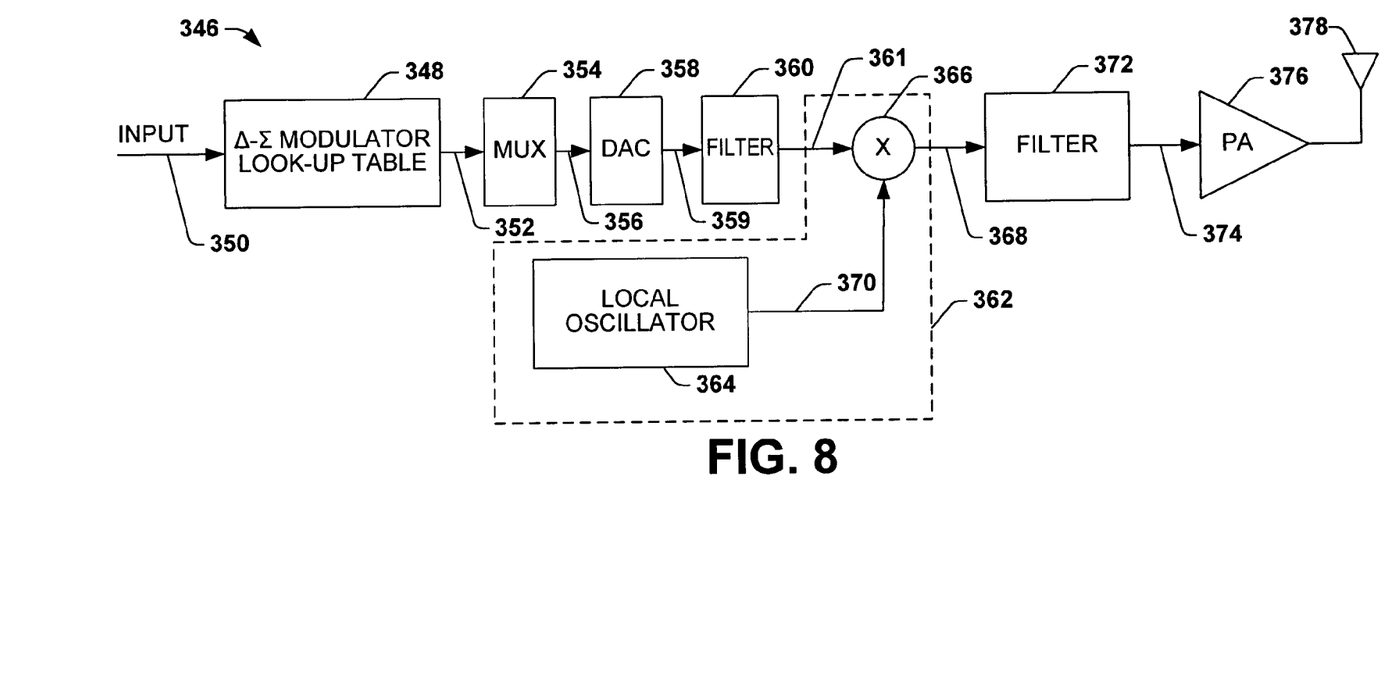
FIG. 8 is a block diagram depicting part of another communications system incorporating a conversion system in accordance with an aspect of the present invention.

FIG. 8 is another example of a portion of a transmit module 346 that can be implemented utilizing a delta-sigma modulator LUT 348 in accordance with an aspect of the present invention. The front end of the module 346 is similar to that shown and described with respect to FIG. 7. Briefly stated, a digital input signal 350 is provided to an input of the delta-sigma modulator LUT 348 (e.g., as shown and described in FIG. 1) that provides a vector of plural output samples 352 to a multiplexer 354. The multiplexer 354 aggregates the plural output samples 352 and provides a corresponding data stream 356 to a corresponding DAC 358. The DAC 358 converts the data stream 356 to an analog signal 359 at a desired intermediate frequency (IF). The IF can be any desired frequency, such as in the MHz range, KHz range or GHz range. A filter 360 receives the analog signal 359 from the DAC 358 and removes out of band signal content and other noise.

The filter 360 provides a filtered IF signal 361 to an upmixing system 362. The upmixing system can include one or more stages of upconversion and mixing, as needed to upmix the signal to a desired carrier frequency. Because a delta-sigma modulator network 352 implemented in accordance with an aspect of the present invention can provide quantized data at a high data rate, most desired frequencies (e.g., in the upper MHz or GHz range) can be achieved through a single stage of upmixing without in-band spurs. The upmixing system 362, in this example, includes a local oscillator 364 and mixer 366 that produce a desired analog signal 368 at a desired transmission frequency based on the IF signal 361. In particular, the local oscillator 364 is utilized to provide a desired carrier frequency 370 at a desired radio transmission frequency. The mixer 366 produces the signal 368 by combining the IF signal 361 with the carrier signal 370 provided by the local oscillator 364.

A filter 372, in turn, optimizes the bandwidth and helps eliminate unwanted out-of-band emissions and errors, such as may result from the upmixing. The filter 372 provides the filtered RF output 374 to an associated power amplifier 376. The power amplifier 376, in turn, provides an amplified signal to an associated antenna 378 for wireless transmission. Those skilled in the art will understand and appreciate various other types of filtering and up-conversion that can be utilized to provide a desired signal utilizing a delta-sigma LUT and DAC arranged in accordance with an aspect of the present invention.

Figure 9:
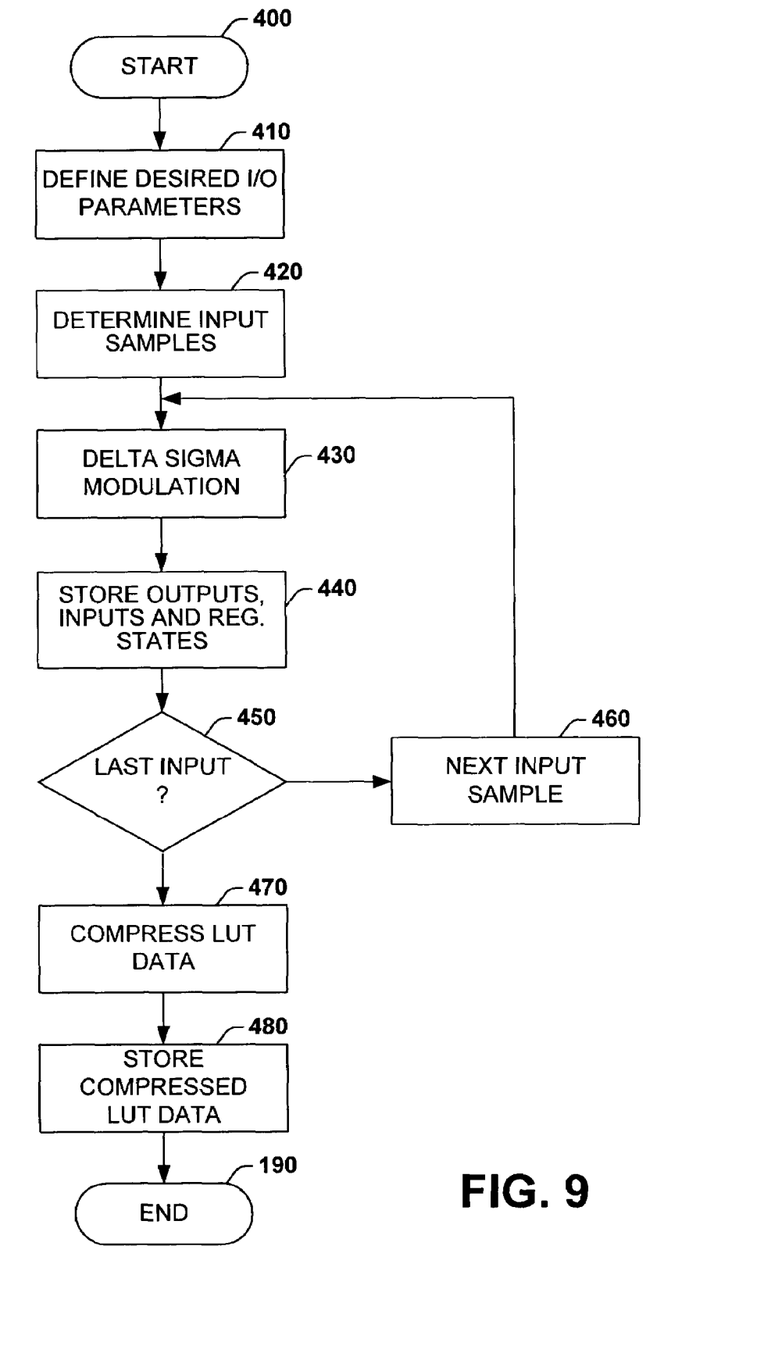
FIG. 9 is a flow diagram illustrating a methodology for generating a look-up table in accordance with an aspect of the present invention.

In view of the examples shown and described above, a methodology for low noise amplification in accordance with the present invention will be better appreciated with reference to the flow diagrams of FIG. 9. While, for purposes of simplicity of explanation, the methodology is shown and described as a executing serially, it is to be understood and appreciated that the present invention is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodology can be implemented in hardware (e.g., one or more integrated circuits), software (e.g., running on a DSP or ASIC) or a combination of hardware and software.

The methodology begins at 400, such as in connection with activating a system or tool that has been designed to facilitate generating and programming delta-sigma look-up table data according to an aspect of the present invention. Such tools can include appropriate design software and hardware programmed and/or configured to perform delta-sigma modulation on a predetermined input sample and store corresponding output data in a desired format.

At 410, desired input and output parameters are defined. For example, the input parameters can include input sample size and number of bits and sample rate for the input. Output parameters can include defining an output sample size and number of bits per sample as well as the output sample rate provided by delta-sigma modulation. The pass band for the delta-sigma modulator also can be user-selectable, which facilitates reprogramming look-up table data to accommodate any desired pass band. Those skilled in the art will appreciate that the sample rates and delta-sigma modulation can be much lower for generating look-up table data than typically would be required for generating outputs for real-time wireless communications applications.

At 420, a set of input samples is determined. The input samples are based on the parameters defined at 410 as well as based on the type and configuration of the delta-sigma modulation that is to be performed. The input samples, for example, can be generated by a baseband modulator or digital signal processor. Alternatively, depending on how the methodology is being implemented, the input samples can be employed as a predetermined set of input samples (e.g., having a predetermined number of one or more bits) that are buffered to a delta-sigma modulator through a suitable memory device.

At 430, delta-sigma modulation is performed on a first of the input samples. The delta-sigma modulation can be implemented as hardware, software or a combination thereof. As is known in the art, the delta-sigma modulation includes upsampling and noise shaping and quantization, such as can be implemented in an IIR filter and associated quantizer. The delta-sigma modulation results in plural quantized output sample for each input sample due to different associated modulator register states. The output samples, register states and inputs for a given set of one or more input samples are stored at 440.

Because the delta-sigma modulation is being performed offline, the processing duration for each sample is inconsequential. As a result, complex and computationally expensive delta-sigma modulation can be utilized for generating the look-up table data in accordance with an aspect of the present invention. Additional filtering functions can be employed to remove extraneous signal portions to ensure high precision in the output, as needed, without compromising operation of the resulting look-up table.

For example, for each input sample (e.g., M bits per sample, where $M \geq 1$), the delta-sigma modulation provides N output samples (e.g., where $N \geq 1$) in which each of the N output samples typically has fewer bits than the input sample and is provided at a faster sample rate than the input sample. It will be appreciated that the output sample rate and input sample rate are flexible parameters for the delta-sigma modulation at 430 since the output samples are not going to be tuned to a desired frequency or otherwise processed further under time constraints usually associated with real-time delta sigma modulation. Instead, the output samples are being used to as look-up table data for programming a memory construct in accordance with an aspect of the present invention.

At 450, a determination is made as to whether a complete set of all input samples and corresponding register states have been processed by delta-sigma modulation (at 430). If the determination is negative, the methodology proceeds to 460. At 460, a next input sample is obtained and the methodology returns to 430 to perform desired delta-sigma modulation on that input sample. After all output samples have been generated and stored to define a complete set of look-up table data, the methodology can continue to 470.

At 470, the stored look-up table data can be compressed. The compression of the data is facilitated because the output data is highly correlated. The correlation in the output occurs since the outputs from sample to sample change very little over time (e.g., for a one-bit output sample, the output may change by only one bit). Additional correlations can exist in look-up table addresses, the state of the delta-sigma modulator, input samples, or a combination thereof. In accordance with one aspect of the present invention, the compression at 470 includes performing additional delta-sigma modulation on the look-up table generated by the delta-sigma modulation. The delta-sigma modulation at 470 provides a high degree of compression. Those skilled in the art will understand and appreciate various types of compression techniques or algorithms that can be utilized to compress the look-up table data 470.

From 470, the methodology proceeds to 480 in which the compressed look-up table data is stored. The stored data can be employed to program a suitable memory device (e.g., SRAM or DRAM) with look-up table data that can be utilized in place of a conventional delta-sigma modulator to provide corresponding outputs for a given set of input samples. As a result, the memory device is operative to emulate the delta-sigma modulation by providing a corresponding vector of the output samples in response to receiving each of the input samples used to program the look-up table data. Advantageously, the look-up table can be fabricated using inexpensive memory technology that runs at speeds lower than typically would be required to run the corresponding delta-sigma modulator hardware and generate comparable outputs in real-time.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A signal conversion system, comprising:
   a memory system programmed to provide a set of digital output samples in response to a given digital input sample, each of a plurality of possible input samples being associated with a corresponding set of plural digital output samples; and
   an aggregator that aggregates the output samples and provides an aggregated output stream signal at a desired output sample rate, which is different from an input sample rate.

2. The conversion system of claim 1, the memory system being programmed to provide N output samples that represent delta-sigma modulated data in response to the given digital input sample, where N is a positive integer greater than one.

3. The conversion system of claim 1, the memory system operating at a rate that is less than the desired output sample rate.

4. The conversion system of claim 1, the memory system further comprising a look-up table programmed to store output data indexed by address data defined as a function of the possible input samples, the address data being functionally related to at least one of state information and outputs of delta-sigma modulation represented by the look-up table, the look-up table providing the set of output samples as a vector of outputs in response to the given input sample, whereby the look-up table can operate in real-time at rates that are slower than would be required for the delta-sigma modulation being represented by the look-up table.

5. The conversion system of claim 4, the memory system further comprising a buffer that receives a digital input signal and buffers a selected portion of the input signal as the given input sample to define the address data for the look-up table.

6. The conversion system of claim 1, at least a portion of data stored in the memory system being compressed data.

7. The conversion system of claim 6, at least a portion of the compressed data having been compressed by delta-sigma modulation.

8. The system of claim 1, further comprising a delta-sigma modulator operative to receive at least one digital input signal and provide corresponding quantized output data that defines the plurality of input samples provided to the memory system at an input sample rate that is less than the output sample rate.

9. The system of claim 8, the quantized output data being generated based on S input samples, where S>=1, to address the memory, such that the memory runs at 1/S times slower than the delta sigma modulator.

10. The system of claim 8, the delta-sigma modulator further comprises a complementary metal-oxide semiconductor (CMOS) delta-sigma modulator.

11. The system of claim 1, further comprising a digital-to-analog converter that converts the aggregated output stream signal to a corresponding analog signal having a center frequency functionally related to the desired output sample rate.

12. A transmitter in combination with the system of claim 11, the combination comprising an antenna operative to propagate a wireless signal at a transmission frequency based on the corresponding analog signal.

13. The system of claim 11, the digital-to-analog converter provides the analog output signal tuned directly at a center frequency that defines a desired radio transmission frequency.

14. The system of claim 1, further comprising:
   a separator operative to split the input samples into in-phase and quadrature components thereof;
   memory system further comprising:
      a first memory system that stores look-up table data representing delta-sigma modulated outputs indexed to provide in-phase components of the output samples based on in-phase components of the input samples; and
      a second memory system that stores look-up table data representing delta-sigma modulated outputs indexed to provide quadrature components of the output samples based on quadrature components of the input samples; and
   an aggregator that aggregates the in-phase and quadrature components of the output samples to provide the aggregated output stream at the desired output sample rate.

15. A conversion system, comprising:
   a buffer that buffers a portion of a digital input signal as a digital input sample at an input sample rate;
   a look-up table programmed to provide a set of digital output samples in response to at least one digital input sample, the at least one digital input sample defining address data for the look-up table, the look-up table providing the set of digital output samples at a sample rate which is different from that of the at least one digital input sample;

an aggregator that aggregates the output samples and provides an aggregated output stream of digital data; and a digital-to-analog converter that converts the aggregated output stream to a corresponding analog signal at a desired output sample rate.

16. The system of claim 15, further comprising a delta-sigma modulator operative to receive a second digital input signal and provide corresponding quantized output data at the input sample rate to define the digital input signal.

17. The system of claim 16, the delta-sigma modulator further comprises a complementary metal-oxide semiconductor (CMOS) delta-sigma modulator.

18. A transmitter in combination with the system of claim 15, the combination comprising an antenna operative to propagate a wireless signal at a transmission frequency based on the corresponding analog signal.

19. The system of claim 15, further comprising:
a separator operative to split the input signal into in-phase and quadrature component samples thereof;
the buffer comprising a pair of buffers, each being operative to buffer a respective one of the in-phase and quadrature component samples in parallel with each other;
the look-up table comprising a pair of look-up table, each being operative to provide plural digital output samples in response to receiving a respective one of the buffered in-phase and quadrature component samples; and
the aggregator being operative to aggregate the in-phase and quadrature components of the output samples from the pair of look-up tables to provide the aggregated output stream of digital data.

20. The system of claim 15, at least a portion of the data stored in the memory system being compressed data.

21. The system of claim 20, at least a portion of the data stored in the memory system having been compressed by delta-sigma modulation.

22. A conversion system, comprising:

means for storing look-up table data representing delta-sigma modulated outputs indexed according to corresponding input samples each having a predetermined number of bits; and means for aggregating output samples provided by the means for storing and for providing an aggregated output data stream at a desired output sample rate.

23. The system of claim 22, further comprising means for splitting an input signal into in-phase and quadrature components;

the means for storing further comprising:
first means for storing look-up table data representing delta-sigma modulated outputs and for providing output samples based on the in-phase components of the input signal; and
second means for storing look-up table data representing delta-sigma modulated outputs and for providing output samples based on the quadrature components of the input signal;

the means for aggregating being operative to aggregate the output samples from the first and second means to provide the aggregated output stream at the desired output sample rate.

24. The system of claim 23, further comprising means for converting the aggregated output stream to an analog signal that is centered at about a desired radio transmission frequency.

25. The system of claim 24, the means for converting further comprising a one-bit digital-to-analog converter.

* * * * *